United States Patent
Ito et al.

(10) Patent No.: US 6,847,154 B2
(45) Date of Patent: Jan. 25, 2005

(54) SURFACE ACOUSTIC WAVE DEVICE AND COMMUNICATION DEVICE

(75) Inventors: Yoshihiro Ito, Muko (JP); Michio Kadota, Kyoto (JP); Koji Fujimoto, Otsu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/255,968

(22) Filed: Sep. 27, 2002

(65) Prior Publication Data

US 2003/0071540 A1 Apr. 17, 2003

(30) Foreign Application Priority Data

Sep. 28, 2001 (JP) ........................................ 2001-302365
Aug. 6, 2002 (JP) ........................................ 2002-229021

(51) Int. Cl.$^7$ .............................................. H03H 9/25
(52) U.S. Cl. .................................................. 310/313 D
(58) Field of Search ........................... 310/313 R, 313 D

(56) References Cited

U.S. PATENT DOCUMENTS

| | | | | |
|---|---|---|---|---|
| 5,802,685 A | * | 9/1998 | Kadota et al. | 29/25.35 |
| 5,814,917 A | * | 9/1998 | Isobe et al. | 310/313 B |
| 6,088,462 A | * | 7/2000 | Fujimoto et al. | 381/160 |
| 6,335,584 B1 | * | 1/2002 | Kadota et al. | 310/313 B |
| 6,455,986 B2 | * | 9/2002 | Chai et al. | 310/358 |
| 6,531,937 B2 | * | 3/2003 | Kadota et al. | 333/193 |
| 2002/0130736 A1 | * | 9/2002 | Mukai et al. | 333/193 |

FOREIGN PATENT DOCUMENTS

| | | | | |
|---|---|---|---|---|
| EP | 0 854 571 A2 | | 7/1998 | ............ H03H/9/64 |
| EP | 1 030 445 A2 | | 8/2000 | ............ H03H/9/25 |
| JP | 9-18270 | * | 1/1997 | ............ H03H/3/08 |
| JP | 2000-244279 | * | 9/2000 | ............ H03H/9/25 |

OTHER PUBLICATIONS

Michio Kadota et al., "BGS Wave Resonator Using Piezoelectric Ceramic Substrate and its Application", The Institute of Electronics, Information and Communication Engineers, Nov. 1996, pp. 41–48.

Hiroshi Shimizu et al., "Resonators Utilizing Reflection of the Piezoelectric Surface Shear Wave at Edge Surfaces", Spring Proc. Of the Acoustical Society of Japan, pp. 351–352, May 1976.

* cited by examiner

*Primary Examiner*—Thomas M. Dougherty
(74) *Attorney, Agent, or Firm*—Keating & Bennett, LLP

(57) ABSTRACT

A Shear Horizontal-type end-surface-reflection-type surface acoustic wave device includes a piezoelectric substrate having end surfaces. The most appropriate positions of the end surfaces of the piezoelectric substrate are determined. Interdigital transducers are disposed on the main surface of the piezoelectric substrate having a comparatively low relative dielectric constant $\in_{11}^T$ (for example, a relative dielectric constant of about 40 or less). The positions of the end surfaces are determined so that the distance from the center of the second electrode finger, counting from the outermost side in the surface acoustic wave propagation direction among the interdigital transducers, to the end surfaces (end surfaces for reflecting the surface acoustic wave) of the piezoelectric substrate satisfy the relationship $(N+5/8)\lambda s \leq L \leq (N+7/8)\lambda s$, where $\lambda s$ is the wavelength of the surface acoustic wave, and N is 0 or a positive integer.

5 Claims, 10 Drawing Sheets

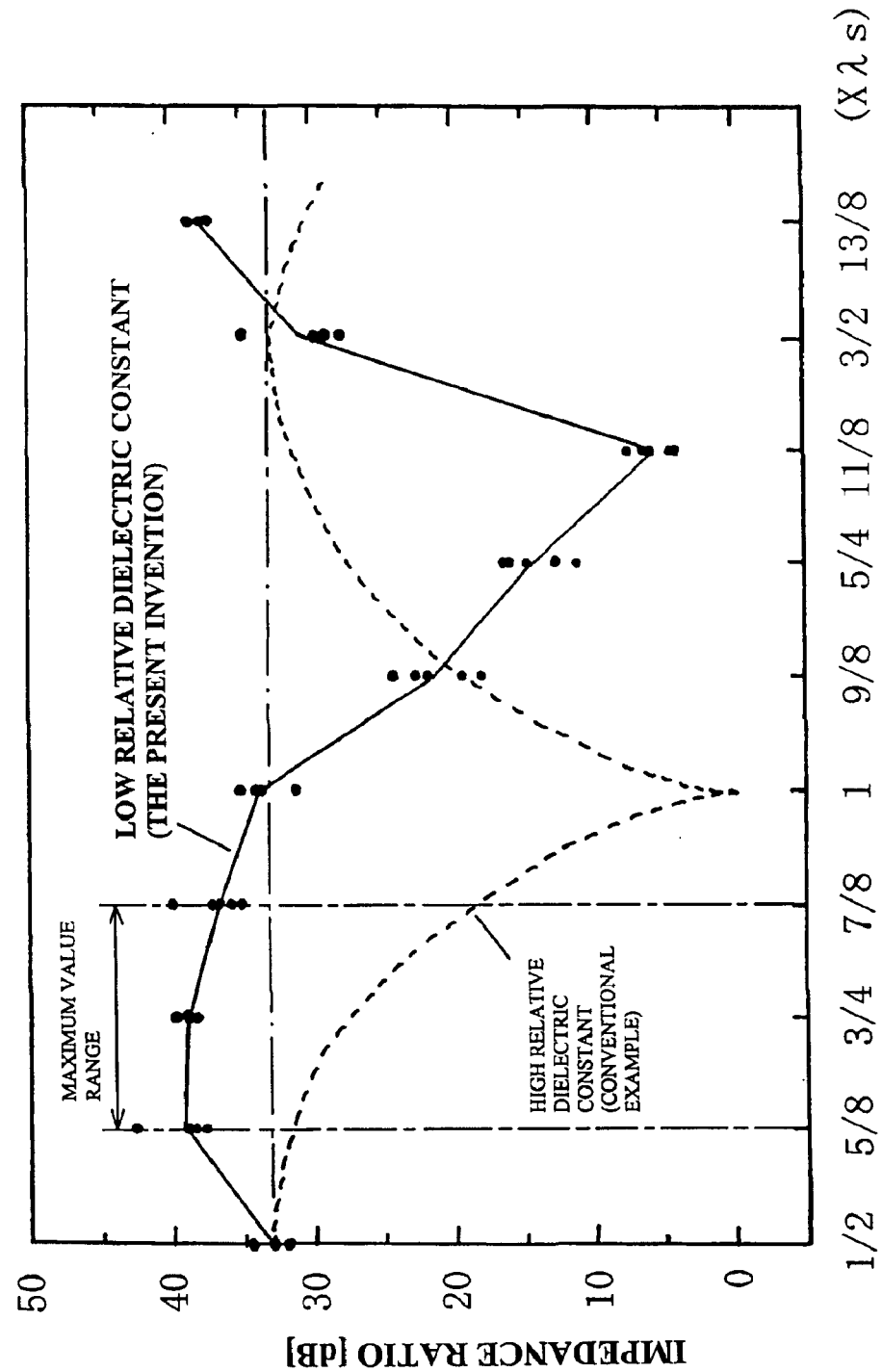

SURFACE ACOUSTIC WAVE DEVICE AND COMMUNICATION DEVICE

BACKGROUND OF THE INVENTION

1. Field of the Invention

The present invention relates to a surface acoustic wave device and a communication device. More particularly, the present invention relates to an end-surface-reflection-type surface acoustic wave device using a Shear Horizontal type (SH-type) surface acoustic wave.

2. Description of the Related Art

Among surface acoustic waves which propagate along a piezoelectric substrate, as SH-type surface acoustic waves having displacement mainly in a direction that is perpendicular to the propagation direction of the surface acoustic wave, there are BGS waves (piezoelectric surface shear waves), Love waves, etc.

As an end-surface-reflection-type surface acoustic wave device using an SH-type surface acoustic wave (BGS wave), there is, for example, the device disclosed in Spring Proc. of the Acoustical Society of Japan, pp.351–352 (published in May, 1976). This surface acoustic wave device has a configuration such as that shown in, for example, FIG. 1. In FIG. 1, reference numeral 1 denotes a piezoelectric substrate, which is formed from a piezoelectric ceramic material. The top surface of the piezoelectric substrate 1 has interdigital transducers 2 and 3 disposed thereon. The interdigital transducers 2 and 3 have plural electrode fingers 2a and 2b, and 3a and 3b, which are arranged so as to interdigitate with each other (among the electrode fingers of the interdigital transducer 2e, the electrode fingers on both ends are denoted as 2b, and the electrode fingers other than those are denoted as 2a; furthermore, among the electrode fingers of the interdigital transducer 3, the electrode fingers at both ends are denoted as 3b, and the electrode fingers other than those are denoted as 3a). The arrow P indicates the polarization direction of the piezoelectric substrate 1. In this surface acoustic wave device, as a result of applying an AC voltage from the interdigital transducers 2 and 3, a BGS wave having only a displacement that is perpendicular to the surface acoustic wave propagation direction A, that is, only a transverse wave component, is excited.

Furthermore, in this surface acoustic wave device, a BGS wave is completely reflected between the free end surfaces 1a and 1b of the piezoelectric substrate 1, thereby trapping the BGS wave between the end surfaces 1a and 1b. That is, this surface acoustic wave device operates as an end-surface-reflection-type surface acoustic wave resonator. In the conventional surface acoustic wave resonator using a Rayleigh wave, reflectors need to be provided beside the interdigital transducer, whereas in the above-described surface acoustic wave device using a BGS wave, such reflectors can be omitted. Therefore, when compared to a conventional surface acoustic wave resonator using a Rayleigh wave, there is a significant advantage in that the chip size can be significantly reduced to approximately 1/10 the size.

FIG. 2 is a sectional view of a surface acoustic wave device parallel to the surface acoustic wave propagation direction. The width of each of the electrode fingers 2a, 2b, and 3a, excluding the electrode fingers 3b at positions in contact with the end surfaces of the piezoelectric substrate 1, is $\lambda s/4$ ($\lambda s$ is the wavelength of the surface acoustic wave). The distance between the centers of the electrode fingers 2a and 2b and the distance between the centers of the electrode fingers 3a are both equal to the wavelength $\lambda s$. However, the width of the electrode fingers 3b at the ends, provided at positions in contact with the end surfaces of the piezoelectric substrate 1, is $\lambda s/8$. Therefore, in this surface acoustic wave device, the distance L from the center of the electrode finger 2b positioned second from the end to the end surfaces 1a and 1b of the piezoelectric substrate 1 is $L=\lambda s/2$.

The following configuration is described in the above-described reference. In the end-surface-reflection-type surface acoustic wave device, it is desirable that the end surfaces 1a and 1b of the piezoelectric substrate 1 are provided at a position at which the distance L from the second electrode finger 2b from the end is half of the wavelength $\lambda s$ of the surface acoustic wave (i.e., $L=\lambda s/2$). If the position of the end surfaces 1a and 1b of the piezoelectric substrate 1 deviates from the position of $L=\lambda s/2$, spurious vibrations are likely to occur.

Furthermore, in the paper entitled "BGS Wave Resonator Using Piezoelectric Ceramic and Applications Thereof", Technical Report (Singaku Gihou), The Institute of Electronics, Information, and Communication Engineers (IEICE), pp.41–48, November 1996, a comparison between a surface acoustic wave device in which the end surface of the piezoelectric substrate is at a distance $L=\lambda s/2$ from the second electrode finger and a surface acoustic wave device in which the end surface of the piezoelectric substrate is provided at a position deviated therefrom is described. In this paper, it is described that when the end surface of the piezoelectric substrate deviates from the most appropriate position, spurious vibrations occur.

However, in the conventional case, in the piezoelectric substrate used for an end-surface-reflection-type surface acoustic wave device, piezoelectric materials having a high relative dielectric constant, for example, $LiNbO_3$, $LiTaO_3$, and PZT, are used, and the most appropriate position of the end surface of the piezoelectric substrate merely means the most appropriate position at which the piezoelectric substrate having a high relative dielectric constant is used. That is, for end-surface-reflection-type surface acoustic wave devices using a piezoelectric substrate having a low relative dielectric constant, the most appropriate position of the end surface of the piezoelectric substrate has not yet been determined.

SUMMARY OF THE INVENTION

In order to solve the problems described above, preferred embodiments of the present invention determine the most appropriate position of the end surface of a piezoelectric substrate in an end-surface-reflection-type surface acoustic wave device including a piezoelectric substrate, in particular, a piezoelectric substrate having a comparatively low relative dielectric constant, and provide an end-surface-reflection-type surface acoustic wave device using such a piezoelectric substrate. In addition, other preferred embodiments of the present invention provide a greatly improved communication device including such a novel surface acoustic wave device.

According to a preferred embodiment of the present invention, a surface acoustic wave device includes an interdigital transducer disposed on a main surface of a piezoelectric substrate, the piezoelectric substrate having an end surface for reflecting a surface acoustic wave, the end surface being located at an position outside of the interdigital transducer, in which the displacement is mainly in a direction that is substantially perpendicular to the propagation direction of the surface acoustic wave among surface acoustic waves which propagate on the piezoelectric substrate, wherein, when the interdigital transducer is a single electrode, the end surface is arranged so that the distance L from the center of the second electrode finger to the end surface, counting from the outermost side in the surface acoustic wave propagation direction, among the electrode fingers, satisfies the following equation $(N+\frac{5}{8})\lambda s \leq L \leq (N+\frac{7}{8})\lambda s$, where $\lambda s$ is the wavelength of the surface acoustic wave, and N is 0 or a positive integer. Here, a single electrode refers to an electrode in which electrode fingers of opposing interdigital transducers are arranged to interdigitate with each other.

In another preferred embodiment of the present invention, a surface acoustic wave device includes an interdigital transducer disposed on a main surface of a piezoelectric substrate, the piezoelectric substrate having an end surface for reflecting a surface acoustic wave, the end surface being located at a position outside of the interdigital transducer, in which the displacement is mainly in a direction that is substantially perpendicular to the propagation direction of the surface acoustic wave among surface acoustic waves which propagate on the piezoelectric substrate, wherein, when the interdigital transducer includes a plurality of electrodes, the end surface is arranged so that the distance L from the middle of the centers of the electrode fingers which define the second same-electrical-potential electrode finger pair to the end surface, counting from the outermost side in the surface acoustic wave propagation direction, among the electrode finger pairs at the same electrical potential, satisfies the following equation $(N+\frac{5}{8})\lambda s \leq L \leq (N+\frac{7}{8})\lambda s$, where $\lambda s$ is the wavelength of the surface acoustic wave, and N is 0 or a positive integer. Here, the interdigital electrode including a plurality of electrodes refers to an electrode in which the electrode fingers of opposing interdigital transducers are arranged to interdigitate with each other in plural (two or more) units.

In another preferred embodiment of the present invention, a surface acoustic wave device includes an interdigital transducer disposed on a main surface of a piezoelectric substrate, the piezoelectric substrate having an end surface for reflecting a surface acoustic wave, the end surface being located at a position outside of the interdigital transducer, in which the displacement is mainly in a direction that is substantially perpendicular to the propagation direction of the surface acoustic wave among surface acoustic waves which propagate on a piezoelectric substrate, wherein, when the interdigital transducer is a single electrode in which the widths of the electrode fingers and the spacing therebetween are not fixed, the center of the second electrode finger, counting from the outermost side in the surface acoustic wave propagation direction, is located at a position deviated by $(\lambda a/2) \times M$, where M is 0 or a positive integer, towards the end surface from the center of the electrode fingers arranged at a spacing closest to ½ of the average wavelength $\lambda a$ of the surface acoustic wave, and the end surface is arranged so that the distance L from the center of the second electrode finger to the end surface, counting from the outermost side, satisfies the following equation $(N+\frac{5}{8})\lambda a \leq L \leq (N+\frac{7}{8})\lambda a$, where $\lambda s$ is the average wavelength of the surface acoustic wave, and N is 0 or a positive integer. In such a single-electrode surface acoustic wave device, the average value of the distances between adjacent electrode fingers, excluding the electrode fingers on the outermost sides, is substantially equal to the average wavelength $\lambda a$. Therefore, in the surface acoustic wave device including the single electrode, it may be said that the center of the second electrode finger, counting from the outermost side in the surface acoustic wave propagation direction, is located at a position deviated by $(K/2) \times M$ (M is 0 or a positive integer) toward the end surface from the middle of the centers of the electrode fingers in portions which are closest to ½ of the average period K $(=\lambda a)$ of the electrode fingers, excluding the electrode fingers on the outermost sides.

In yet another preferred embodiment of the present invention, a surface acoustic wave device includes an interdigital transducer disposed on a main surface of a piezoelectric substrate, the piezoelectric surface having an end surface for reflecting a surface acoustic wave, the end surface being located a position outside of the interdigital transducer, in which the displacement is mainly in a direction that is substantially perpendicular to the propagation direction of the surface acoustic wave among surface acoustic waves which propagate on a piezoelectric substrate, wherein, when the interdigital transducer includes a plurality of electrodes in which the widths of the electrode fingers and the spacing therebetween are not fixed, the center of the second same-electrical-potential electrode finger pair, counting from the outermost side in the surface acoustic wave propagation direction, is located at a position deviated by $(\lambda a/2) \times M$, where M is 0 or a positive integer, towards the end surface from the middle of the centers of the electrode finger pairs arranged at a spacing closest to ½ of the average wavelength $\lambda a$ of the surface acoustic wave, and the end surface is arranged so that the distance L from the center of the second same-electrical-potential electrode finger pair to the end surface, counting from the outermost side, satisfies the following equation $(N+\frac{5}{8})\lambda a \leq L \leq (N+\frac{7}{8})\lambda a$, where $\lambda a$ is the average wavelength of the surface acoustic wave, and N is 0 or a positive integer. Here, the center of the electrode finger pair refers to the middle of the centers of the electrode fingers which form the same-electrical-potential electrode finger pair. In such a surface acoustic wave device including a double electrode, the average value of the distances between adjacent electrode finger pairs, excluding the same-electrical-potential electrode finger pairs on the outermost sides, is substantially equal to the average wavelength $\lambda a$. Therefore, in the surface acoustic wave device including the double electrode, it may be said that the center of the second same-electrical-potential electrode finger, counting from the outermost side in the surface acoustic wave propagation direction, is located at a position deviated by $(K/2) \times M$ (M is 0 or a positive integer) from the middle of the centers of the electrode finger pairs in portions closest to ½ of the average period K $(=\lambda a)$ of the electrode finger pairs, excluding the electrode finger pairs on the outermost sides.

The surface acoustic wave devices in accordance with the above-described preferred embodiments of the present invention are preferably surface acoustic wave devices using an SH-type surface acoustic wave using, in particular, a BGS wave or a Love wave, in which the displacement is mainly in a direction that is substantially perpendicular to the propagation direction of the surface acoustic wave among the surface acoustic waves propagating on the piezoelectric substrate. For the piezoelectric substrate, it is preferable that a piezoelectric substrate having a comparatively low relative dielectric constant $\in_{11}^{T}$ be used. Here, the relative dielectric constant $\in_{11}^{T}$ being comparatively low means that the relative dielectric constant is lower than that of a piezoelectric material, such as $LiNbO_3$, $LiTaO_3$, or PZT, conventionally used as the piezoelectric substrate in end-surface-reflection-type surface acoustic wave devices. In particular, as a piezoelectric substrate having a comparatively low relative dielectric constant $\in_{11}^{T}$, a piezoelectric substrate formed from a piezoelectric material having a relative dielectric constant $\in_{11}^{T}$ of about 40 or less serves as a standard. Furthermore, a specific example of a piezoelectric substrate having a comparatively low relative dielectric constant $\in_{11}^{T}$ includes a piezoelectric substrate formed from a quartz crystal (for example, the relative dielectric constant $\in_{11}^{T}$ is about 4.6), or a single crystal having a $Ca_3Ga_2Ge_4O_{14}$-type structure, or a single crystal having a trigonal crystal structure. An example of an oxide single crystal having a $Ca_3Ga_2Ge_4O_{14}$-type structure includes langasite ($La_3Ga_5SiO_{14}$). The end surface for reflecting the surface acoustic wave, provided on the piezoelectric substrate, may be defined by an outer peripheral surface of the piezoelectric substrate or may be defined by a groove provided on the main surface of the piezoelectric substrate. Alternatively, an end surface for reflecting the surface acoustic wave may be provided on both sides of the piezoelectric substrate or may be provided at only one side of the piezoelectric substrate.

According to preferred embodiments of the present invention, in the end-surface-reflection-type surface acoustic wave device including such a piezoelectric substrate, it has become clear that the most appropriate position of the end surface for reflecting a surface acoustic wave, in the case of a single electrode, is a position at which the distance L from the center of the second electrode finger, counting from the outermost side in the surface acoustic wave propagation direction, among the interdigital transducers, satisfies $(N+5/8)\lambda s \leq L \leq (N+7/8)\lambda s$, where $\lambda s$ is the wavelength of the surface acoustic wave, and N is 0, 1, 2, . . . Furthermore, in the end-surface-reflection-type surface acoustic wave device including a piezoelectric substrate, as a result of providing an end surface for reflecting the surface acoustic wave at the most appropriate position, no-ripple (spurious vibration) and high impedance ratio (a peak-to-valley ratio=20 Log (Za/Zr) of an impedance Zr at the resonance frequency to an impedance Za in the anti-resonance frequency) characteristics can be obtained.

Furthermore, in the case of a double electrode, it has become clear that the most appropriate position of the end surface for reflecting the surface acoustic wave in the end-surface-reflection-type surface acoustic wave device including a piezoelectric substrate is a position at which a distance L from the middle of the centers of the electrode fingers which define the second same electrical potential electrode finger pair, counting from the outermost side in the surface acoustic wave propagation direction, among the electrode finger pairs at the same electrical potential, satisfies $(N+5/8)\lambda s \leq L \leq (N+7/8)\lambda s$, where $\lambda s$ is the wavelength of the surface acoustic wave, and N is 0, 1, 2 . . . . Furthermore, in the end-surface-reflection-type surface acoustic wave device including a piezoelectric substrate, as a result of providing an end surface for reflecting the surface acoustic wave at the most appropriate position, characteristics such that no ripples (spurious vibration) occur and an impedance ratio (a peak-to-valley ratio=20 Log(Za/Zr) of an impedance Zr at the resonance frequency to an impedance Za at the anti-resonance frequency) is high can be obtained.

In the case of a single electrode in which the widths of the electrode fingers and the spacing therebetween are not fixed, the end surface is arranged so that the center of the second same-electrical-potential electrode finger pair, counting from the outermost side in the surface acoustic wave propagation direction, is located at a position deviated by $(\lambda a/2) \times M$, where M is 0 or a positive integer, towards the end surface from the middle of the centers of the electrode finger pairs arranged at a spacing closest to ½ of the average wavelength $\lambda a$ of the surface acoustic wave, and the distance L from the center of the second electrode finger, counting from the outermost side, satisfies $(N+5/8)\lambda a \leq L \leq (N+7/8)\lambda a$, where N is 0, 1, 2 . . . Thus, characteristics such that no ripples (spurious vibration) occur and an impedance ratio (a peak-to-valley ratio=20 Log(Za/Zr) of an impedance Zr at the resonance frequency to an impedance Za at the anti-resonance frequency) is high can be obtained.

In the case of an interdigital transducer having a plurality of electrodes in which the widths of the electrode fingers and the spacing therebetween are not fixed, the end surface is arranged so that the center of the second same-electrical-potential electrode finger pair, counting from the outermost side in the surface acoustic wave propagation direction, is located at a position deviated by $(\lambda a/2) \times M$, where M is 0 or a positive integer, towards the end surface from the middle of the centers of the electrode finger pairs arranged at a spacing closest to ½ of the average wavelength $\lambda a$ of the surface acoustic wave, and the distance L from the center of the second same-electrical-potential electrode finger pair, counting from the outermost side satisfies $(N+5/8)\lambda a \leq L \leq (N+7/8)\lambda a$, where N is 0, 1, 2 . . . Thus, characteristics such that there are no ripples (spurious vibration) and an impedance ratio (a peak-to-valley ratio=20 Log(Za/Zr) of an impedance Zr at the resonance frequency to an impedance Za at the anti-resonance frequency) is high can be obtained.

Furthermore, the surface acoustic wave device according to various preferred embodiments of the present invention is suitable for use in a communication device.

According to the end-surface-reflection-type surface acoustic wave device of preferred embodiments of the present invention, in an end-surface-reflection-type surface acoustic wave device including a piezoelectric substrate, characteristics such that there are no ripples (spurious vibration) and an impedance ratio is high can be obtained. As a result, it is possible to obtain a satisfactory end-surface-reflection-type surface acoustic wave device which has a high response and which can realize a stable oscillation state, and it is possible to obtain a satisfactory end-surface-reflection-type surface acoustic wave device which has a low insertion loss and which has a satisfactory flat passing-band characteristic.

Other features, elements, characteristics and advantages of the present invention will become more apparent from the following detailed description of preferred embodiments thereof with reference to the attached drawings.

BRIEF DESCRIPTION OF THE DRAWINGS

FIG. 5 shows results in which variations in the impedance ratio with respect to the distance L from the center of the second electrode finger, counting from the outermost side, to the end surface for reflecting a surface acoustic wave are measured;

DETAILED DESCRIPTION OF PREFERRED EMBODIMENTS

Figure 1:
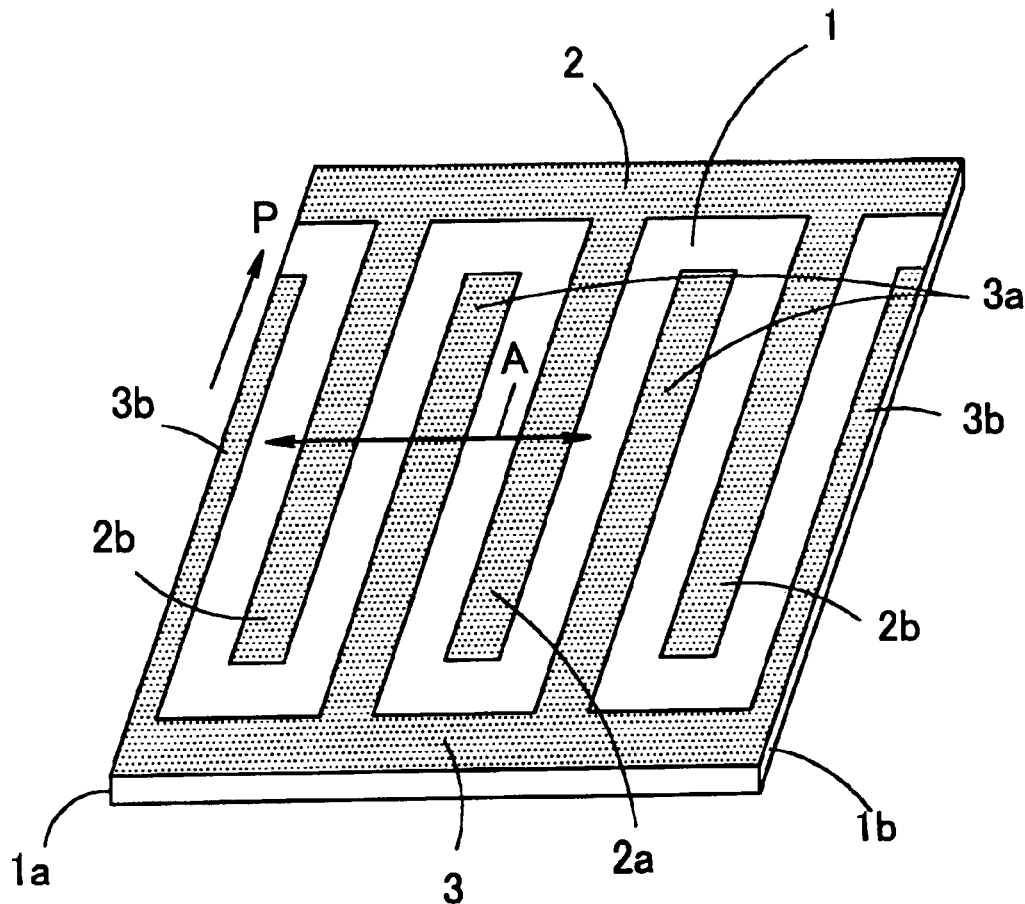
FIG. 1 is a perspective view showing a surface acoustic wave device according to a conventional example.
Figure 2:
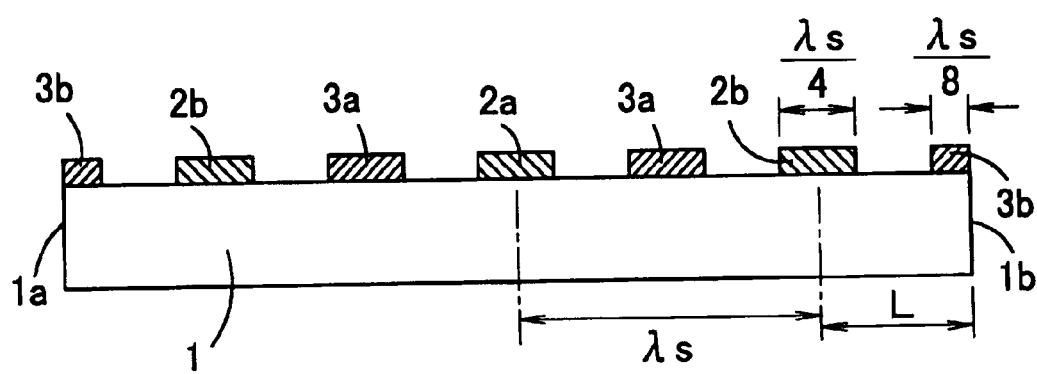
FIG. 2 is a sectional view of the surface acoustic wave device of FIG. 1 parallel to the surface acoustic wave propagation direction.
Figure 3:
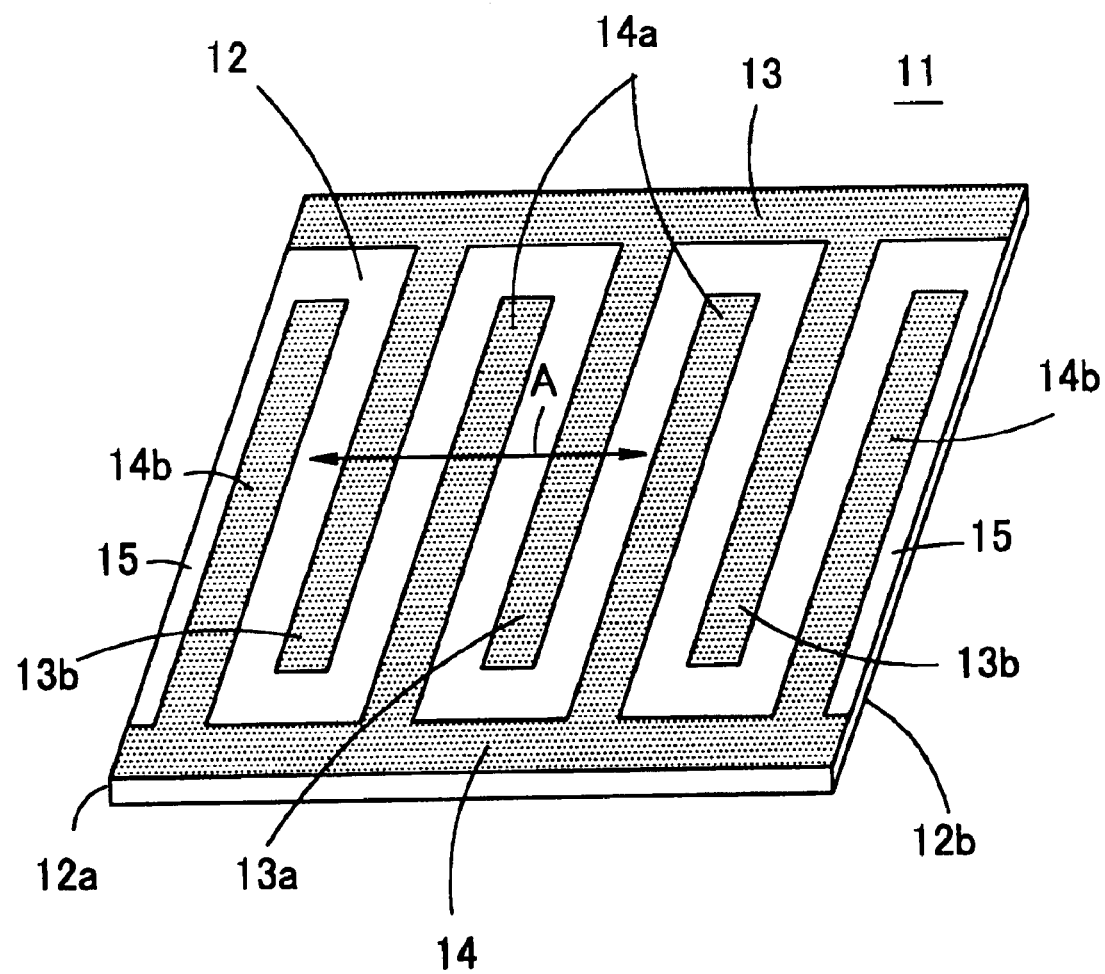
FIG. 3 is a perspective view showing a surface acoustic wave device according to a preferred embodiment of the present invention.

FIG. 3 is a perspective view showing a surface acoustic wave device having a single electrode according to a preferred embodiment of the present invention. In an end-surface-reflection-type surface acoustic wave device 11, a pair of interdigital transducers 13 and 14 are preferably provided on one of the main surfaces of a piezoelectric substrate 12. Both the interdigital transducers 13 and 14 are patterned on the main surface of the piezoelectric substrate 12 preferably by a method such as vapor deposition, and have a plurality of electrode fingers 13a and 13b, and 14a and 14b, respectively, (among the electrode fingers of the interdigital transducer 13, the electrode fingers at both ends are denoted as 13b, and electrode fingers other than those are denoted as 13a; and furthermore, among the electrode fingers of the interdigital transducer 14, the electrode fingers at both ends are denoted as 14b, and electrode fingers other than those are denoted as 14a) which interdigitate with each other. The piezoelectric substrate 12 is preferably made of a quartz crystal or langasite material having a relative dielectric constant $\in_{11}^T$ which is comparatively low, and has end surfaces 12a and 12b for reflecting a surface acoustic wave formed therein.

Also, in this end-surface-reflection-type surface acoustic wave device 11, when an AC input voltage is applied to the interdigital transducers 13 and 14, an SH-type surface acoustic wave is excited, and the excited SH wave propagates in a direction connecting the end surfaces 12a and 12b with each other (surface acoustic wave propagation direction A). This SH wave is reflected between the end surfaces 12a and 12b and is trapped therebetween, and a standing wave occurs between the end surfaces 12a and 12b. As a result, the surface acoustic wave device 11 can be made to operate as an end-surface-reflection-type resonator using an SH wave.

Figure 4A:
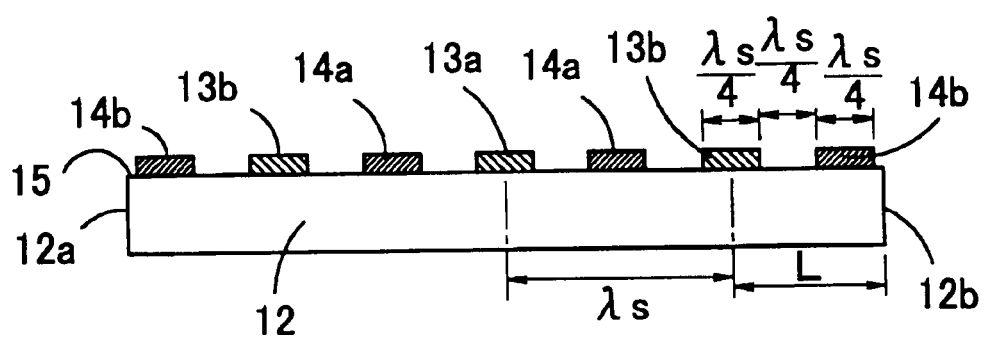
FIGS. 4A and 4B are sectional views showing a cross section view parallel to the surface acoustic wave propagation direction of the surface acoustic wave device, also showing sectional views of the surface acoustic wave device in which the distances from the center of the second electrode finger, counting from the outermost side, to the end surface are different.

In this surface acoustic wave device 11, as shown in FIG. 4A, the widths of the electrode fingers 13a and 13b, and 14a and 14b of the interdigital transducers 13 and 14 are approximately λs/4 (λs is the wavelength of the surface acoustic wave), and the distances between the electrode fingers 13a and 13b and between 14a and 14b are also approximately λs/4. Furthermore, as shown in FIG. 4A, the distance L from the center of the second electrode finger 13b, counting from the outermost side in the surface acoustic wave propagation direction A, among the interdigital transducers 13 and 14, to the end surfaces 12a and 12b preferably satisfies the following equation (1):

$$(N+5/8)\lambda s \leq L \leq (N+7/8)\lambda s \qquad (1)$$

where λs is the wavelength of the surface acoustic wave, and N is 0, 1, 2, . . (non-negative integer). Furthermore, between the electrode fingers 14b at the ends and the end surfaces 12a and 12b, an area 15, in which there is no electrode and in which the piezoelectric substrate 12 is exposed, is provided. The distances from the second electrode fingers 13b on the right and left may not be equal (that is, they may not take the same value of N).

Figure 4B:
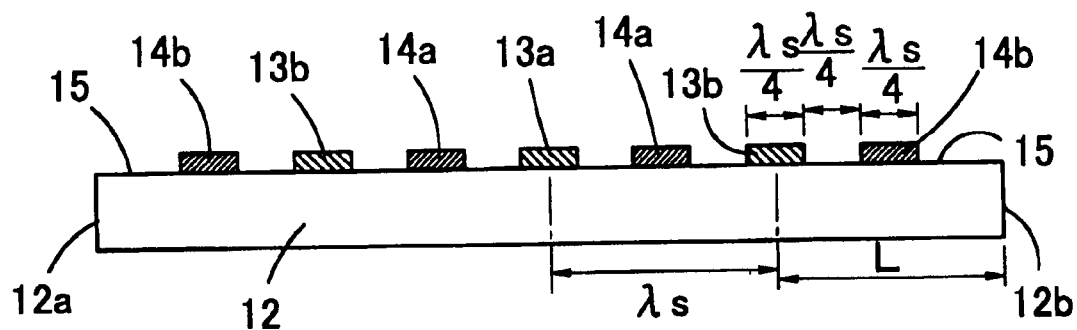

FIG. 4B shows the case in which the distance L is λs and in which relatively large electrode-free areas 15 are provided between the electrode fingers 14b at the ends and the end surfaces 12a and 12b. In contrast, FIG. 4A shows the case in which the distance L is slightly larger than approximately λs/2.

FIG. 5 shows results in which changes in the impedance ratio (the ratio 20 Log(Za/Zr) of the impedance Zr at the resonance point to the impedance Za at the anti-resonance point) with respect to the distance L from the center of the second electrode finger from the end to the end surface for reflecting the surface acoustic wave are measured. The solid line indicates the case of preferred embodiments of the present invention in which a piezoelectric substrate having a comparatively low relative dielectric constant is used, and the broken line indicates the case of the conventional example in which a piezoelectric substrate having a comparatively high relative dielectric constant is used. In the case of the conventional example, the distance L reaches a maximum value at λs/2, whereas, in the case of the surface acoustic wave device 11 of preferred the present invention, the impedance ratio has a maximum value in the range indicated by the following equation (2):

$$(5/8)\lambda s \leq L \leq is\ (7/8)\lambda s \qquad (2)$$

Since the phase of the vibration and the vibration state are the same even at positions where the end surfaces 12a and 12b of the piezoelectric substrate 12 are deviated by an amount equal to the wavelength λs of the surface acoustic wave, equation (2) described above can be generalized as equation (1) described above (a portion thereof can be confirmed from FIG. 5).

Figure 6:
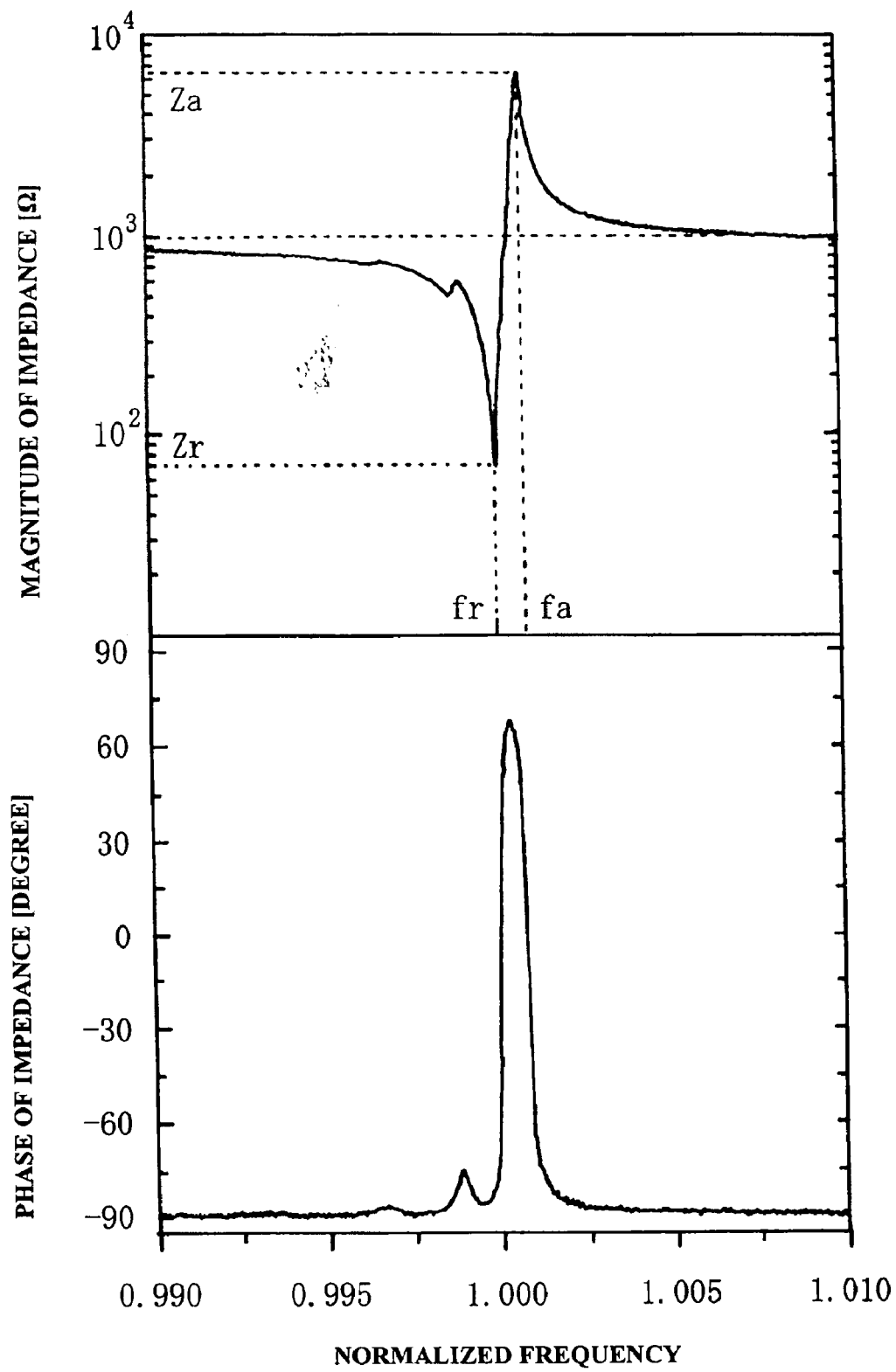
FIG. 6 shows changes in the magnitude and phase of the impedance when the distance L from the center of the second electrode finger, counting from the outermost side in the surface acoustic wave propagation direction, is about 3λs/4, and the frequency is changed in the surface acoustic wave device using a piezoelectric substrate having a comparatively low relative dielectric constant.

FIG. 6 shows the magnitude and phase of the impedance when the distance L from the center of the second electrode finger 13b, counting from the outermost side in the surface acoustic wave propagation direction, to the end surfaces 12a and 12b of the piezoelectric substrate 12 is (3/4)λs, and the frequency (in the horizontal axis in FIG. 6, the frequency is normalized so that the resonance frequency becomes 1) is changed in the surface acoustic wave device using the piezoelectric substrate 12 having a comparatively low relative dielectric constant. In this piezoelectric substrate 12, in spite of the fact that the end surfaces 12a and 12b are located at positions which are deviated greatly from the most appropriate end surface position L=λs/2 in the conventional example, characteristics such that there are no ripples or spurious vibration and that the impedance ratio (20 Log(Za/Zr)) is high can be obtained.

When langasite is used as a piezoelectric substrate having a low relative dielectric constant in a manner similar to a quartz crystal, the same results as those in FIGS. 5 and 6 can be obtained.

Therefore, in the surface acoustic wave device including a single electrode using a piezoelectric substrate which has a relative dielectric constant $\in_{11}^T$ that is comparatively low, by determining the distance L from the center of the second electrode finger, counting from the outermost side in the surface acoustic wave propagation direction, among the electrode fingers to the end surface of the piezoelectric substrate, so that $(N+5/8)\lambda s \leq L \leq (N+7/8)\lambda s$ is satisfied, characteristics having no ripples (spurious vibration) and having an impedance ratio higher than the maximum value of the conventional impedance ratio which can be obtained at the distance of the end surface can be obtained. As a result, it is possible to realize a satisfactory end-surface-reflection-type surface acoustic wave device using an SH wave, which is capable of realizing a stable oscillation state.

Figure 7:
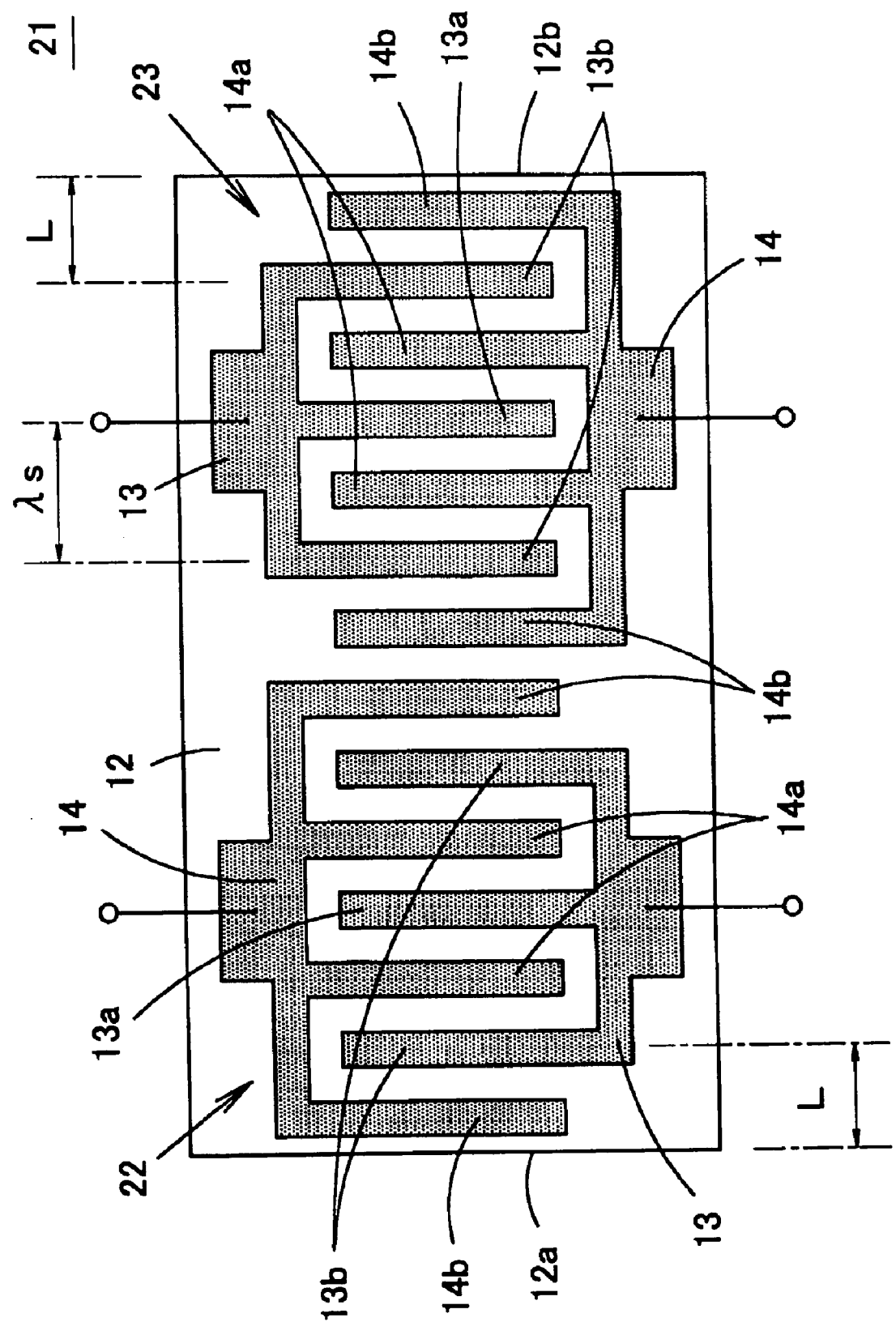
FIG. 7 is a plan view of an end-surface-reflection-type longitudinally-coupled-resonator-type filter according to another preferred embodiment of the present invention.

FIG. 7 shows a plan view of an end-surface-reflection-type longitudinally-coupled-resonator-type filter (surface acoustic wave device) 21 according to another preferred embodiment of the present invention. An example of this end-surface-reflection-type longitudinally-coupled-resonator-type filter 21 is shown in FIG. 7. In this end-surface-reflection-type longitudinally-coupled-resonator-type filter 21, a set of surface acoustic wave resonators 22 and 23, in which two interdigital transducers 13 and 14 are combined, are arranged in a horizontal sequence on one of the main surfaces of a piezoelectric substrate 12. The end surfaces at both ends of the piezoelectric substrate 12, positioned in the surface acoustic wave propagation direction A, define end surfaces 12a and 12b for reflecting the surface acoustic wave.

In this longitudinally-coupled-resonator-type filter 21, when an input voltage is applied between the interdigital transducers 13 and 14 of one surface acoustic wave resonator 22, an SH-type surface acoustic wave is excited, and the excited SH wave propagates in the direction coupling the end surfaces 12a and 12b. This surface acoustic wave is reflected between the end surfaces 12a and 12b, the fundamental wave of the surface acoustic wave and the high-order mode wave are coupled, and a standing wave is generated between the end surfaces 12a and 12b. An output based on this standing wave is extracted from the interdigital transducers 13 and 14 of the other surface acoustic wave resonator 23, and the filter can be made to operate as the longitudinally-coupled-resonator-type filter 21 using the SH wave.

For this longitudinally-coupled-resonator-type filter 21, the positions of the end surfaces 12a and 12b are preferably set such that the distance L from the center of the second electrode finger 13b, counting from the outermost side in the surface acoustic wave propagation direction, to the end surfaces 12a and 12b for reflecting the surface acoustic wave satisfies the condition $(N+5/8)\lambda s \leq L \leq (N+7/8)\lambda s$. As a result, since the impedance at the resonance frequency becomes low and no ripples occur, the insertion loss of the end-surface-reflection-type longitudinally-coupled-resonator-type filter 21 is reduced, and the flatness of the characteristic within the passing band is improved. Furthermore, the sharpness of the pass band becomes satisfactory.

Although in this preferred embodiment, a longitudinally-coupled-resonator-type filter is described as an end-surface-reflection-type surface acoustic wave device, the end-surface-reflection-type surface acoustic wave device is not limited to this type, and a transversely-coupled-resonator-type filter, a ladder-type filter, or other type of filter, may be used.

Although in each of the above-described preferred embodiments, a description is given by setting the width of each electrode finger to approximately $\lambda s/4$, the width is not limited to this value. Furthermore, although the widths of the electrode fingers on the outermost sides are described as being approximately $\lambda s/4$, the width is not limited to this value.

Figures 8A, 8B:
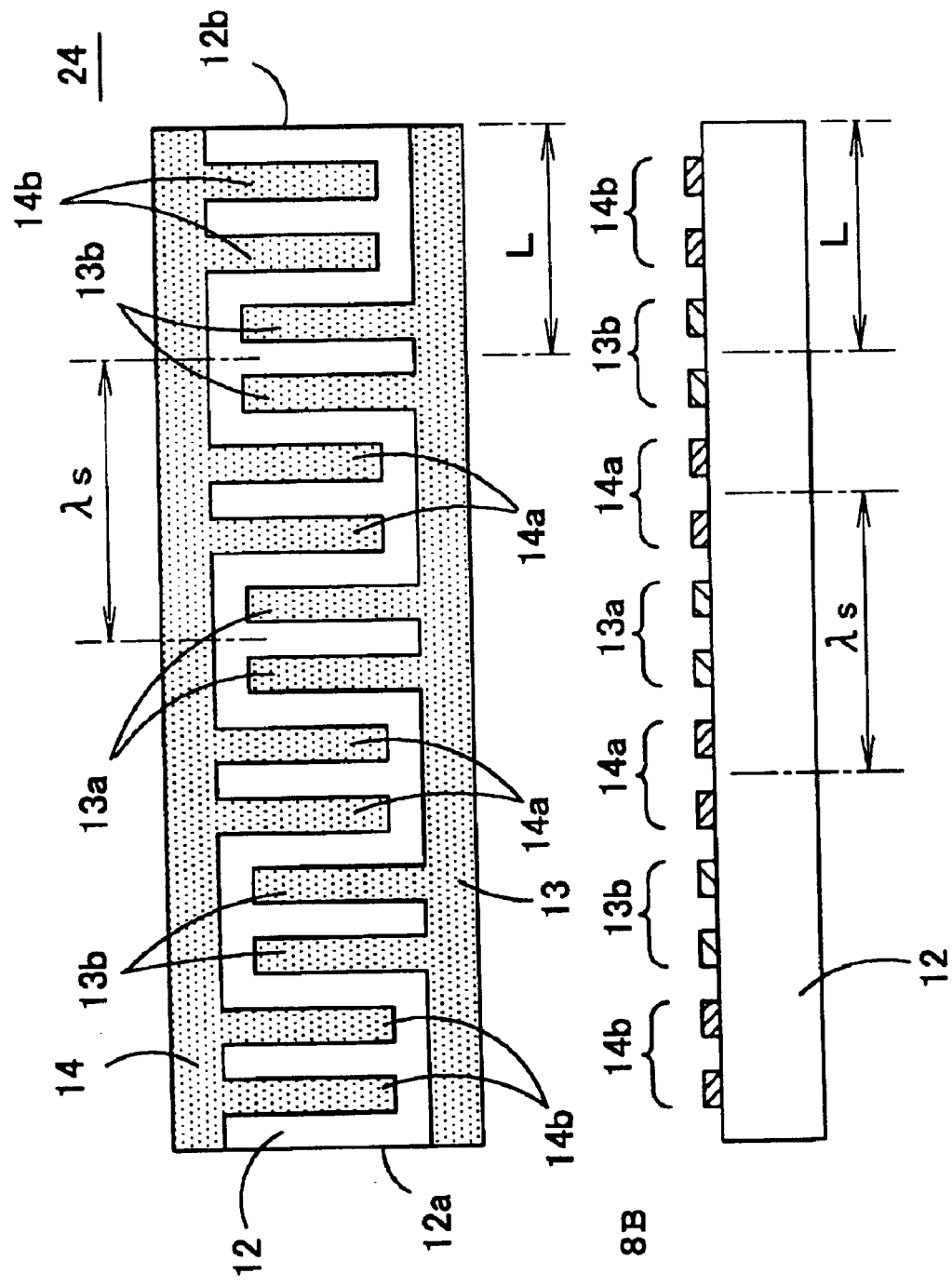
FIGS. 8A and 8B are respectively a plan view and a sectional view of a surface acoustic wave device according to another preferred embodiment of the present invention.

FIGS. 8A and 8B are respectively a plan view and a sectional view of a surface acoustic wave device according to another preferred embodiment of the present invention. This surface acoustic wave device has multiple-electrode interdigital transducers (the case of a double electrode is shown in FIG. 8A), and the multiple electrodes are arranged such that an electrode finger pair is defined by a plurality of adjacent electrode fingers in the same interdigital transducer and that the electrode finger pairs of the opposing interdigital transducers interdigitate with each other. In this end-surface-reflection-type surface acoustic wave device 24, a pair of interdigital transducers 13 and 14 is disposed on one of the main surfaces of the piezoelectric substrate 12. In the interdigital transducer 13, a plurality (two in FIG. 8A) of electrode fingers 13a and 13b define an electrode finger pair at the same electrical potential (in the case of the multi-electrode, among the electrode fingers of the interdigital transducer 13, the electrode fingers which define the electrode finger pairs on both ends are denoted as 13b, and the electrode fingers which define the electrode finger pairs other than those are denoted as 13a). In the interdigital transducer 14, a plurality (two in FIG. 8A) of adjacent electrode fingers 14a and 14b define an electrode finger pair at the same electrical potential (in the case of the multi-electrode, among the electrode fingers of the interdigital transducer 14, the electrode fingers which define the electrode finger pairs on both ends are denoted as 14b, and the electrode fingers which define the electrode finger pairs other than those are denoted as 14a). The plurality of electrode fingers 13a and 13b which define an electrode finger pair, and the plurality of the electrode fingers 14a and 14b which define an electrode finger pair are alternately arranged. Also, in this case, the piezoelectric substrate 12 is preferably made of a quartz crystal or langasite having a comparatively low relative dielectric constant $\in_{11}^T$, and has the end surfaces 12a and 12b for reflecting the surface acoustic waves generated thereon.

In this surface acoustic wave device 24, as shown in FIGS. 8A and 8B, the widths of the electrode fingers 13a and 13b, and 14a and 14b of the interdigital transducers 13 and 14 are preferably less than approximately $\lambda s/4$ ($\lambda s$ is the wavelength of the surface acoustic wave), and both the distance between the centers of the adjacent electrode finger pairs of the interdigital transducer 13, and the distance between the centers of the adjacent electrode finger pairs of the interdigital transducer 14 are approximately $\lambda s$. Furthermore, as shown in FIGS. 8A and 8B, the distance L from the middle of the centers of the electrode fingers 13b and 13b which define the second electrode finger pair, counting from the outermost side in the surface acoustic wave propagation direction A, among the electrode finger pairs of the interdigital transducers 13 and 14, to the end surfaces 12a and 12b, satisfies the following equation:

$$(N+5/8)\lambda s \leq L \leq (N+7/8)\lambda s$$

where $\lambda s$ is the wavelength of the surface acoustic wave, and N is 0, 1, 2, . . . (non-negative integer).

Therefore, in the multiple-electrode surface acoustic wave device including a piezoelectric substrate having a relative dielectric constant $\in_{11}^T$ that is comparatively low, by determining the distance L from the middle of the centers of the electrode fingers which define the second same-electricalpotential electrode finger pair, counting from the outermost side in the surface acoustic wave propagation direction among the same-electrical-potential electrode finger pairs, to the end surface so that $(N+5/8)\lambda s \leq L \leq (N+7/8)\lambda s$ is satisfied, characteristics having no ripples (spurious vibration) and having an impedance ratio higher than the maximum value of the conventional impedance ratio which can be obtained at the distance of the end surface can be obtained. As a result, it is possible to realize a satisfactory end-surface-reflection-type surface acoustic wave device using an SH wave, which is capable of realizing a stable oscillation state.

Figure 9:
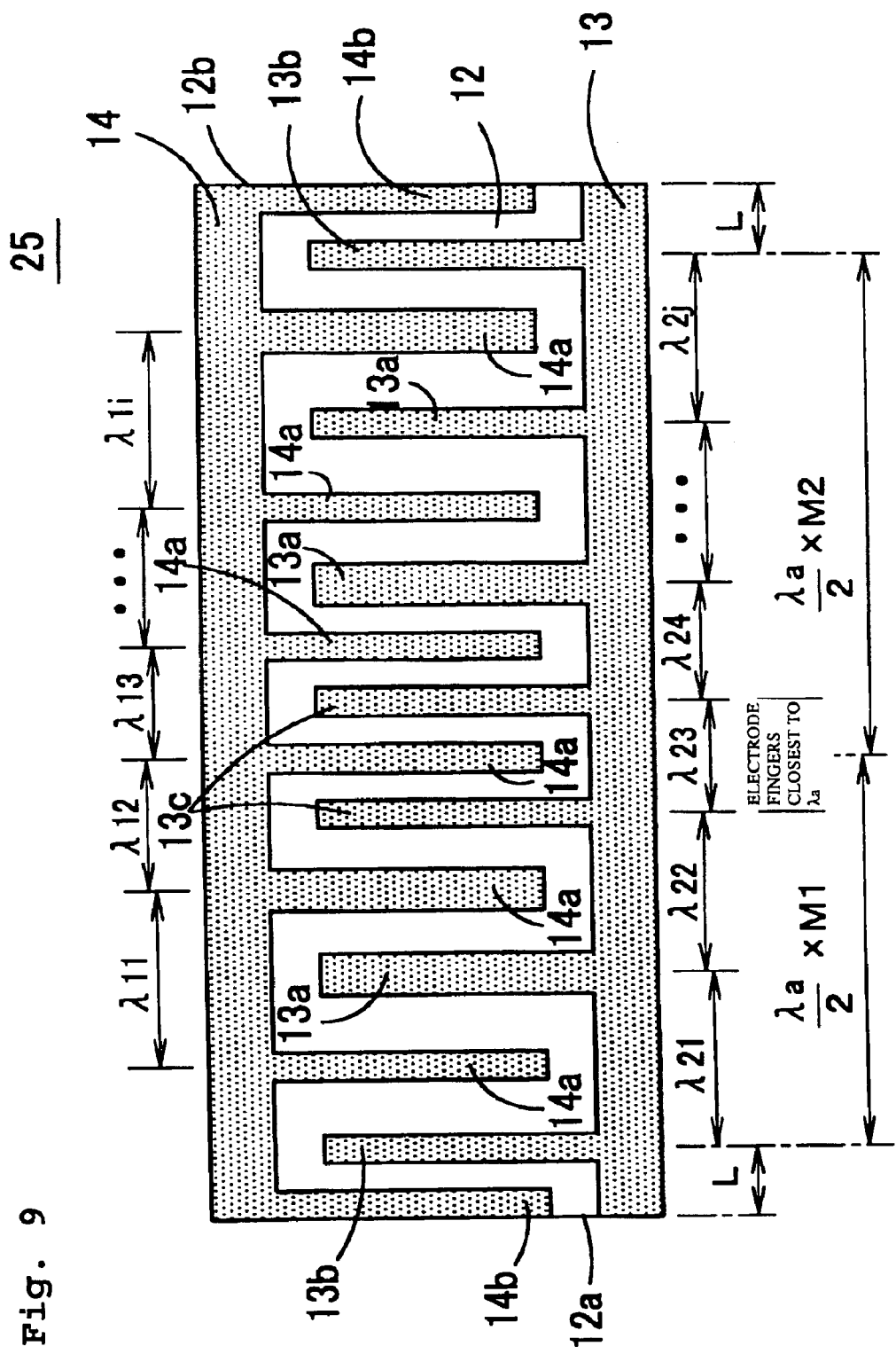
FIG. 9 is a plan view of a surface acoustic wave device according to another preferred embodiment of the present invention.

FIG. 9 is a plan view showing a surface acoustic wave device 25 according to another preferred embodiment of the present invention. In this preferred embodiment, interdigital transducers 13 and 14 having single electrodes, in which the widths of the electrode fingers or the spacing therebetween are not fixed, are provided. As shown in FIG. 9, when the distances between the centers of the electrode fingers 14a, excluding the electrode finger 14b on the outermost side, in the interdigital transducer 14, are denoted as $\lambda 11$, $\lambda 12$, ... $\lambda 1i$, and the distances between the centers of the electrode fingers 13a, 13b, and 13c in the interdigital transducer 13, are denoted as $\lambda 21$, $\lambda 22$, ..., $\lambda 2j$, the average value $\lambda a$ of the distances between these electrode fingers is expressed by the following equation (3). In this type of surface acoustic wave device 25, this average value $\lambda a$ of the distances between these electrode fingers is normally designed so as to become substantially equal to the average wavelength of the surface acoustic wave:

$$\lambda a = \frac{\sum_{n=1}^{i} \lambda 1n + \sum_{m=1}^{j} \lambda 2m}{i+j} \quad (3)$$

Furthermore, a set of electrode fingers, which are spaced at a distance closest to the average value $\lambda a$ among distances among the electrode fingers 13a, 13b, and 13c of the interdigital transducer 13, and distances between the electrode fingers 14a of the interdigital transducer 14, is assumed to be, for example, electrode fingers 13c and 13c, as shown in FIG. 9.

In this surface acoustic wave device 25, the positions of the centers of the second electrode fingers 13b and 13b are determined so that the distances from the center of the electrode fingers 13b and 13b on the right and left, positioned second from the outermost side to the middle of the centers of the electrode fingers 13c and 13c close to the average distance become, respectively:

$\lambda a/2 \times M1 (M1=0, 1, 2, \ldots)$, $\lambda a/2 \times M2 (M2=0, 1, 2, \ldots)$.

Furthermore, the positions of the end surfaces 12a and 12b are determined so that both the distances L from the centers of the electrode fingers 13b and 13b on the right and left, positioned second counting from the outermost side, to the end surfaces 12a and 12b of the piezoelectric substrate 12, satisfy $(N+5/8)\lambda a \leq L \leq (N+7/8)\lambda a$. However, as described above, the values of N may not be equal for the distances between the centers of the electrode fingers 13b on the right and left and the end surfaces 12a and 12b.

Under these conditions, since the impedance at the resonance frequency becomes low, and no ripples occur, an insertion loss in a surface acoustic wave device having single electrodes of random dimensions can be reduced, and the flatness of the characteristics within the passing band is improved. Furthermore, the sharpness of the passing band becomes satisfactory.

Figure 10:
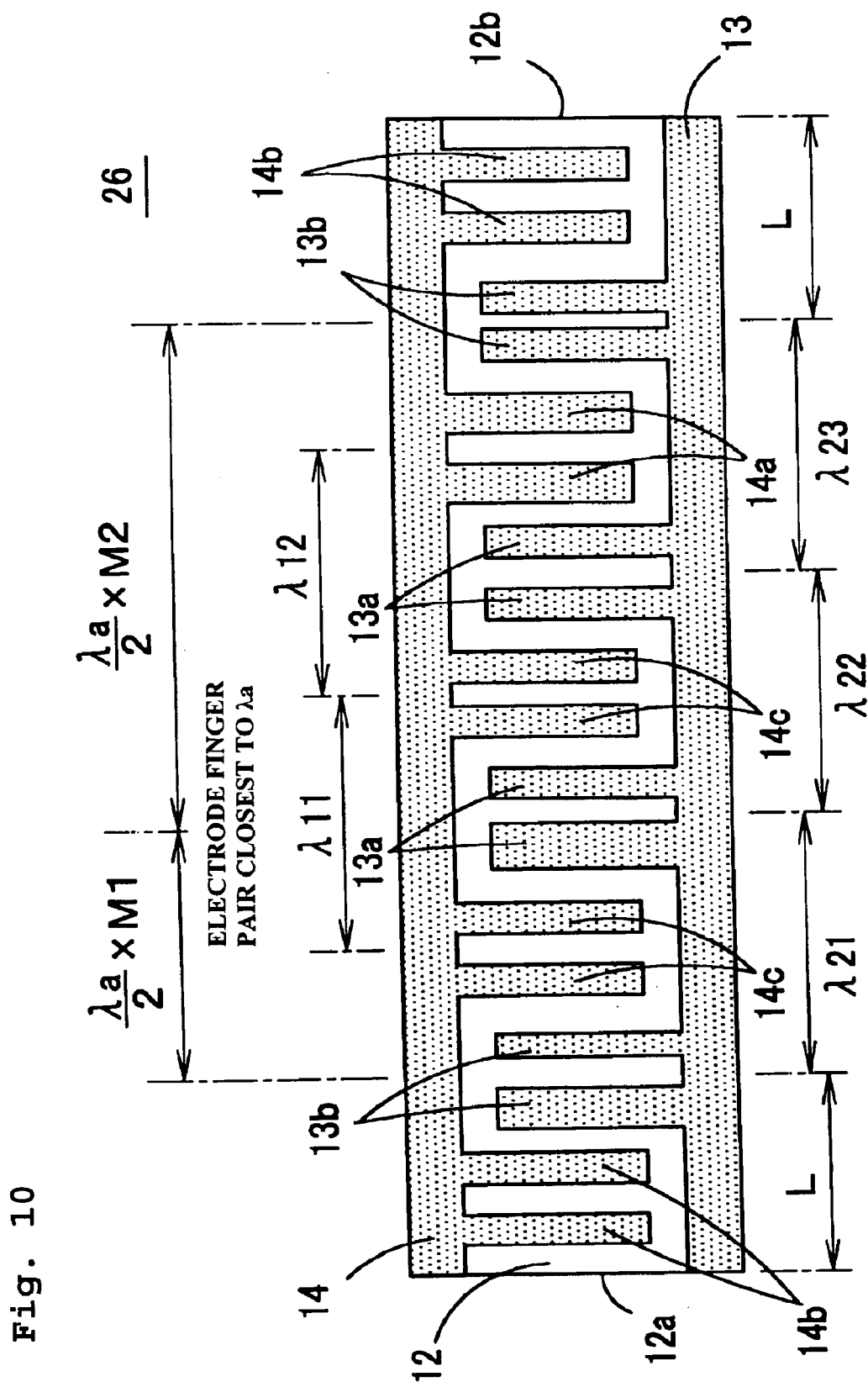
FIG. 10 is a plan view of a surface acoustic wave device according to another preferred embodiment of the present invention.
Figure 11:
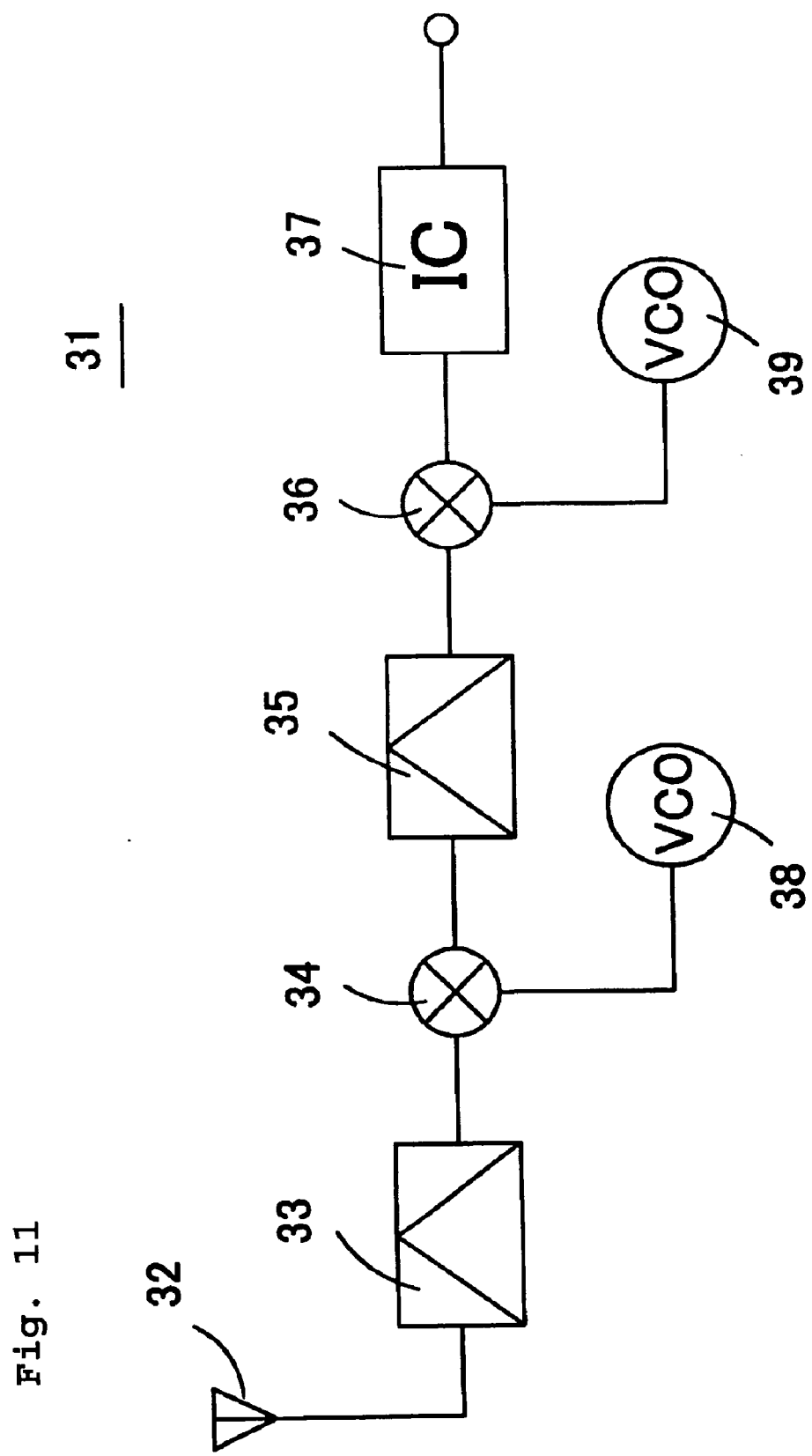
FIG. 11 is a block diagram of a receiving apparatus using a surface acoustic wave device according to another preferred embodiment of the present invention.

FIG. 10 is a plan view of a surface acoustic wave device 26 according to another preferred embodiment of the present invention. In this preferred embodiment, interdigital transducers 13 and 14 having multiple-electrodes (in FIG. 10, the case of double electrodes is shown) in which the widths of electrode fingers or the spacing therebetween are not fixed, are provided. As shown in FIG. 10, when the distances between the centers (the middle of the centers of the electrode fingers 14a, and 13c which define each electrode finger pair) of the electrode finger pairs 14a and 14c, excluding the electrode finger pair 14b on the outermost side, in the interdigital transducer 14, are denoted as $\lambda 11$, $\lambda 12$, ... $\lambda 1i$, and the distances between the centers (the middle of the centers of the electrode finger pairs 13a, 13b, and 13c which define each electrode finger pair) of the electrode finger pairs 13a, 13b, and 13c in the interdigital transducer 13, are denoted as $\lambda 21$, $\lambda 22$, ..., $\lambda 2j$, the average value $\lambda a$ of the distances between these electrode finger pairs is expressed by the following equation (4). In this type of surface acoustic wave device 26, this average value $\lambda a$ of the distances between these electrode finger pairs is normally designed so as to become substantially equal to the average wavelength of the surface acoustic wave:

$$\lambda a = \frac{\sum_{n=1}^{i} \lambda 1n + \sum_{m=1}^{j} \lambda 2m}{i+j} \quad (4)$$

Furthermore, a set of electrode finger pairs, which are spaced at the distance closest to the average value $\lambda a$ among each distance between the electrode finger pairs 13a, 13b, and 13c of the interdigital transducer 13, and each distance between the electrode finger pairs 14a and 14c of the interdigital transducer 14 assumed to be electrode fingers 14c and 14c, as shown in, for example, FIG. 10.

In this surface acoustic wave device 26, the positions of the centers of the second electrode fingers 13b and 13b are determined so that the distances from the centers of the electrode finger pairs 13b and 13b on the right and left positioned second from the outermost side to the middle of the centers of the electrode fingers 14c and 14c close to the average distance become, respectively:

$\lambda a/2 \times M1 (M1=0, 1, 2, \ldots)$ $\lambda a/2 \times M2 (M2=0, 1, 2, \ldots)$ Furthermore, the positions of the end surfaces 12a and 12b are determined so that both the distances L from the centers of the electrode finger pairs 13b and 13b on the right and left, positioned second counting from the outermost side, to the end surfaces 12a and 12b of the piezoelectric substrate 12 satisfy $(N+5/8)\lambda a \leq L \leq (N+7/8)\lambda a$. Also, in this case, the values of N may not be equal for the distance between the center of the electrode finger pairs 13b on the right and left and the end surfaces 12a and 12b.

Under these conditions, since the impedance at the resonance frequency becomes low, and no ripples occur, an insertion loss in a surface acoustic wave device having multiple-electrodes of random dimensions can be reduced, and the flatness of the characteristics within the passing band is greatly improved. Furthermore, the sharpness of the passing band becomes satisfactory.

The surface acoustic wave device of various preferred embodiments of the present invention can be used as a receiving apparatus (receiving stage) for a portable phone or a wireless communication device, or other suitable apparatus. For example, FIGS. 8A and 8B are block diagrams of a receiving apparatus in which the surface acoustic wave device according to various preferred embodiments of the present invention is used as an RF-stage filter 33 or an IF-stage filter 35. This receiving apparatus 31 is configured in such a manner that the RF-stage filter 33, a mixer 34, the IF-stage filter 35, a mixer 36, and an amplifier (IC) 37 are connected to an receiving antenna 32, and that voltage controlled oscillators (VCO) 38 and 39 are connected to the mixers 34 and 36, respectively.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A surface acoustic wave device comprising:

a piezoelectric substrate having an end surface for reflecting a surface acoustic wave generated thereon;

a single interdigital transducer disposed on a main surface of the piezoelectric substrate and having a plurality of electrode fingers, the end surface of the piezoelectric substrate being spaced away from an outside edge of the outermost electrode finger of said interdigital transducer;

wherein said end surface is arranged so that the distance L from the center of the second electrode finger to the end surface, counting from the outermost side in the surface acoustic wave propagation direction, among the electrode fingers, satisfies the following equation:

$$(N+5/8)\lambda s \leq L \leq (N+7/8)\lambda s$$

where $\lambda s$ is the wavelength of the surface acoustic wave, and N is 0 or a positive integer.

2. A surface acoustic wave device according to claim 1, wherein said piezoelectric substrate is made from a piezoelectric material having a relative dielectric constant $\in_{11}^{T}$ that is about 40 or less.

3. A surface acoustic wave device according to claim 1, wherein said piezoelectric substrate Is made of one of a quartz crystal, a single crystal having a $Ca_3Ga_2Ge_4O_{14}$-type structure, and a single crystal having a trigonal crystal structure.

4. A surface acoustic wave device according to claim 1, wherein said surface acoustic wave device defines a longitudinally-coupled-resonator-type filter.

5. A communication device comprising a surface acoustic wave device according to claim 1.

* * * * *